(12) United States Patent
Das et al.

(10) Patent No.: US 7,067,176 B2
(45) Date of Patent: Jun. 27, 2006

(54) METHOD OF FABRICATING AN OXIDE LAYER ON A SILICON CARBIDE LAYER UTILIZING AN ANNEAL IN A HYDROGEN ENVIRONMENT

(75) Inventors: Mrinal Kanti Das, Durham, NC (US); Lori A. Lipkin, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/045,542

(22) Filed: Oct. 26, 2001

(65) Prior Publication Data

US 2002/0102358 A1 Aug. 1, 2002

Related U.S. Application Data

(63) Continuation-in-part of application No. 09/968,391, filed on Oct. 1, 2001, and a continuation-in-part of application No. 09/834,283, filed on Apr. 12, 2001.

(60) Provisional application No. 60/294,307, filed on May 30, 2001, provisional application No. 60/237,822, filed on Oct. 3, 2000, and provisional application No. 60/237,426, filed on Oct. 3, 2000.

(51) Int. Cl.
  *B05D 3/04* (2006.01)
  *B05D 3/02* (2006.01)
  *B05D 5/12* (2006.01)

(52) U.S. Cl. .................... 427/377; 427/376.2; 427/378; 427/126.3; 427/255.27; 438/787

(58) Field of Classification Search ............. 427/376.2, 427/126.3, 377, 378, 255.27; 438/787
See application file for complete search history.

(56) References Cited

U.S. PATENT DOCUMENTS

| | | | |
|---|---|---|---|
| 3,924,024 A | 12/1975 | Naber et al. ................ 427/95 |
| 4,069,058 A * | 1/1978 | Washburn ................ 501/96.5 |
| 4,466,172 A | 8/1984 | Batra ........................ 29/571 |
| 4,875,083 A | 10/1989 | Palmour ................... 357/23.6 |
| 5,030,600 A * | 7/1991 | Hida et al. ................ 501/98.3 |

(Continued)

FOREIGN PATENT DOCUMENTS

| DE | 198 09 554 | 9/1998 |
|---|---|---|
| DE | 19900171 | 12/2000 |

(Continued)

OTHER PUBLICATIONS

Xu et al., "Improved Performance and Reliability of N2O Grown Oxynitride on 6H–SiC", IEEE Electron Device Letters, vol. 21, No. 6, Jun. 2000, ppg. 298–300.*

(Continued)

*Primary Examiner*—Bret Chen
(74) *Attorney, Agent, or Firm*—Myers Bigel Sibley & Sajovec, P.A.

(57) ABSTRACT

Silicon carbide structures are fabricated by fabricating a nitrided oxide layer on a layer of silicon carbide and annealing the nitrided oxide layer in an environment containing hydrogen. Such a fabrication of the nitrided oxide layer may be provided by forming the oxide layer in at least one of nitric oxide and nitrous oxide and/or annealing an oxide layer in at least one of nitric oxide and nitrous oxide. Alternatively, the nitrided oxide layer may be provided by fabricating an oxide layer and fabricating a nitride layer on the oxide layer so as to provide the nitrided oxide layer on which the nitride layer is fabricated. Furthermore, annealing the oxide layer may be provided as a separate step and/or substantially concurrently with another step such as fabricating the nitride layer or performing a contact anneal. The hydrogen environment may be pure hydrogen, hydrogen combined with other gases and/or result from a hydrogen precursor. Anneal temperatures of 400° C. or greater are preferred.

10 Claims, 6 Drawing Sheets

U.S. PATENT DOCUMENTS

| | | | | |
|---|---|---|---|---|
| 5,114,887 | A | * | 5/1992 | Sekine et al. ............... 501/95.1 |
| 5,170,231 | A | | 12/1992 | Fujii et al. .................. 357/23.2 |
| 5,170,455 | A | | 12/1992 | Goossen et al. ............... 385/89 |
| 5,184,199 | A | | 2/1993 | Fujii et al. ...................... 29/10 |
| 5,479,316 | A | | 12/1995 | Smrtic et al. ............... 361/322 |
| 5,506,421 | A | | 4/1996 | Palmour ....................... 257/77 |
| 5,510,630 | A | | 4/1996 | Agarwal et al. ............... 257/77 |
| 5,554,204 | A | * | 9/1996 | Kotaka et al. ................ 65/60.8 |
| 5,587,870 | A | | 12/1996 | Anderson et al. ........... 361/313 |
| 5,726,463 | A | | 3/1998 | Brown et al. .................. 257/77 |
| 5,739,564 | A | | 4/1998 | Kosa et al. .................. 257/298 |
| 5,763,905 | A | | 6/1998 | Harris .......................... 257/77 |
| 5,837,572 | A | | 11/1998 | Gardner et al. ............. 438/199 |
| 5,877,045 | A | | 3/1999 | Kapoor ....................... 438/151 |
| 5,885,870 | A | | 3/1999 | Maiti et al. .................. 438/261 |
| 5,939,763 | A | | 8/1999 | Hao et al. .................... 257/411 |
| 5,960,289 | A | | 9/1999 | Tsui et al. ................... 438/257 |
| 5,972,801 | A | | 10/1999 | Lipkin et al. ............... 438/770 |
| 6,025,608 | A | | 2/2000 | Harris et al. .................. 257/77 |
| 6,028,012 | A | * | 2/2000 | Wang .......................... 438/779 |
| 6,048,766 | A | | 4/2000 | Gardner et al. ............. 438/257 |
| 6,054,352 | A | | 4/2000 | Ueno .......................... 438/268 |
| 6,063,698 | A | | 5/2000 | Tseng et al. ................ 438/585 |
| 6,096,607 | A | | 8/2000 | Ueno .......................... 438/522 |
| 6,100,169 | A | | 8/2000 | Suvorov et al. ............ 438/519 |
| 6,107,142 | A | | 8/2000 | Suvorov et al. ............ 438/285 |
| 6,117,735 | A | | 9/2000 | Ueno .......................... 438/268 |
| 6,136,728 | A | | 10/2000 | Wang .......................... 438/773 |
| 6,165,822 | A | | 12/2000 | Okuno et al. ............... 438/142 |
| 6,171,905 | B1 | * | 1/2001 | Morita et al. ............... 438/257 |
| 6,190,973 | B1 | | 2/2001 | Berg et al. .................. 438/275 |
| 6,204,203 | B1 | | 3/2001 | Narwankar et al. ......... 438/785 |
| 6,211,035 | B1 | | 4/2001 | Moise et al. ................ 438/396 |
| 6,221,700 | B1 | | 4/2001 | Okuno et al. ............... 438/151 |
| 6,228,720 | B1 | | 5/2001 | Kitabatake et al. ......... 438/268 |
| 6,238,967 | B1 | | 5/2001 | Shiho et al. ................ 438/244 |
| 6,239,463 | B1 | | 5/2001 | Williams et al. ............ 257/328 |
| 6,246,076 | B1 | | 6/2001 | Lipkin et al. .................. 257/77 |
| 6,261,976 | B1 | * | 7/2001 | Dong .......................... 438/786 |
| 6,297,172 | B1 | | 10/2001 | Kashiwagi .................. 438/773 |
| 6,316,791 | B1 | | 11/2001 | Schorner et al. .............. 257/77 |
| 6,342,748 | B1 | | 1/2002 | Nakamura et al. |
| 6,344,663 | B1 | | 2/2002 | Slater, Jr. et al. ............. 257/77 |
| 6,455,892 | B1 | | 9/2002 | Okuno et al. ............... 257/328 |
| 6,524,877 | B1 | * | 2/2003 | Nakazawa et al. ............ 438/48 |
| 6,593,620 | B1 | | 7/2003 | Hshieh et al. ............... 257/335 |
| 6,632,747 | B1 | * | 10/2003 | Niimi et al. ................ 438/775 |
| 6,767,843 | B1 | | 7/2004 | Lipkin et al. |
| 2001/0055852 | A1 | | 12/2001 | Moise et al. ................ 438/396 |
| 2002/0072247 | A1 | | 6/2002 | Lipkin et al. ............... 438/767 |
| 2002/0148824 | A1 | * | 10/2002 | Hauf et al. .................. 219/411 |
| 2003/0094446 | A1 | * | 5/2003 | Tay et al. .................... 219/411 |
| 2004/0101625 | A1 | | 5/2004 | Das et al. |

FOREIGN PATENT DOCUMENTS

| | | |
|---|---|---|
| DE | 10036208 | 2/2002 |
| EP | 0 637 069 A1 | 2/1995 |
| EP | 0 637 069 B1 | 1/2001 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 02000252461 A | 9/2000 |
| JP | 2000-252461 A | * 9/2000 |
| JP | 2000106371 | 4/2001 |
| WO | WO 97/17730 | 5/1997 |
| WO | WO 97/39485 | 10/1997 |
| WO | WO 98/02924 | 1/1998 |
| WO | WO99/63591 | 12/1999 |
| WO | WO 00/13236 | 3/2000 |

OTHER PUBLICATIONS

M. K. Das, L.A. Lipkin, J.W. Palmour, G.Y. Chung, J.R. Williams, K. McDonald, and L.C. Feldman, "High Mobility 4H–SiC Inversion Mode MOSFETs Using Thermally Grown, NO Annealed $SiO_2$," *IEEE Device Research Conference*, Denver, CO Jun. 19–21, 2000.

G.Y. Chung, C.C. Tin, J.R. Williams, K. McDonald, R.A. Weller, S.T. Pantelides, L.C. Feldman, M.K. Das, and J.W. Palmour, "Improved Inversion Channel Mobility fo 4H–SiC MOSETs Following High Temperature Anneals in Nitric Oxide," *IEE Electron Device Letters* accepted for publication.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in 4H." *Applied Physics Letters*, vol. 76, No. 13, pp. 1713–1715, Mar. 2000.

P.T. Lai, Supratic Chakraborty, C.L. Chan, and Y.C. Cheng, "Effects of nitridation and annealing on interface properties of thermally oxidized $SiO_2$/SiC metal–oxide–semiconductor system." *Applied Physics Letters*, vol. 76, No. 25, pp. 3744–3746, Jun. 2000.

J.P. Xu, P.T. Lai, C.L. Chan, B. Li, and Y.C. Cheng, "Improved Performance and Reliability of $N_2O$–Grown Oxynitride on 6H–SiC," *IEEE Electron Device Letters*, vol. 21, No. 6, pp. 298–300, Jun. 2000.

L.A. Lipkin and J.W. Palmour, "Low interface state density oxides on p–type SiC," *Materials Science Forum* vols. 264–268, pp. 853–856, 1998.

A.K. Agarwal, J.B. Casady, L.B. Rowland, W.F. Valek, M.H. White, and C.D. Brandt, "1.1 kV 4H–SiC Power UMOSFET's," *IEEE Electron Device Letters*, vol. 18, No. 12, pp. 586–588, Dec. 1997.

A.K. Agarwal, J.B. Casady, L.B. Rowland, W.F. Valek, and C.D. Brandt, "1400 V 4H–SiC Power MOSFET's," *Materials Science Forum* vols. 264–268, pp. 989–992, 1998.

J. Tan, J.A. Cooper, Jr., and Mr.R. Melloch, "High–Voltage Accumulation–Layer UMOSFETs in 4H–SiC," *IEEE Electron Device Letters*, vol. 19, No. 12, pp. 487–489, Dec. 1998.

J.N. Shenoy, J.A. Cooper and M.R. Meelock, "High–Voltage Double–Implanted Power MOSFETs in 6H–SiC," *IEEE Electron Device Letters*, vol. 18, No. 3, pp. 93–95, Mar. 1997.

J.B. Casady, A.K. Agarwal, L.B. Rowland, W.F. Valek, and C.D. Brandt, "900 V DMOS and 1100 V UMOS 4H–SiC Power FETs," *IEEE Device Research Conference*, Ft. Collins, CO Jun. 23–25, 1997.

R. Schörner, P. Friedrichs, D. Peters, H. Mitlehner, B. Weis, and D. Stephani, "Rugged Power MOSFETs in 6H–SiC with Blocking Capability up to 1800 V," *Materials Science Forum* vols. 338–342, pp. 1295–1298, 2000.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30–Jul.2, 1999.

A.V. Suvorov, L.A. Lipkin, G.M. Johnson, R. Singh and J.W. Palmour, "4H–SiC Self–Aligned Implant–Diffused Structure for Power DMOSFETs," *Materials Science Forum* vols. 338–342, pp. 1275–1278, 2000.

R. Schorner, P. Friedrichs, D. Peters, and D. Stephani, "Significantly Improved Performance of MOSFETs on Silicon Carbide Using the 15R–SiC Polytype," *IEEE Electron Device Letters*, vol. 20, No. 5, pp. 241–244, May 1999.

S.T. Pantelides, "Atomic Scale Engineering of SiC Dielectric Interfaces," DARPA/MTO High Power and ONR Power Switching MURI Reviews, Rosslyn, VA, Aug. 10–12, 1999.

V.V. Afanas'ev, M. Bassler, G. Pensl, and M. Schulz, "Intrinsic SiC/$SiO_2$ Interface States," *Phys. Stat. Sol. (a)*, vol. 162, pp. 321–337, 1997.

S. Sridevan, P.K. McLarty, and B.J. Baliga, "On the Presence of Aluminum in Thermally Grown Oxides on 6H–Silicon Carbide," *IEEE Electron Device Letters*, vol. 17, No. 3, pp. 136–138, Mar. 1996.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H–Silicon Carbide," *Journal of Electronic Materials*, vol. 28, No. 3, pp. 214–218, Mar. 1999.

M.K. Das, J.A. Cooper, Jr., M.R. Melloch, and M.A. Capano, "Inversion Channel Mobility in 4H– and 6H–SiC MOSFETs," *IEEE Semiconductor Interface Specialists Conference*, San Diego, CA, Dec. 3–5, 1998.

P.M. Shenoy and B.J. Baliga, "The Planar 6H–SiC ACCUFET: A New High–Voltage Power MOSFET Structure," *IEEE Electron Device Letters*, vol. 18, No. 12, pp. 589–591, Dec. 1997.

Ranbir Singh, Sei–Hyung Ryu and John W. Palmour, "High Temperature, High Current, 4H–SiC Accu–DMOSFET," Materials Science Forum vols. 338–342, pp. 1271–1274, 2000.

Y. Wang, C. Weitzel, and M. Bhatnagar, "Accumulation–Mode SiC Power MOSFET Design Issues," *Materials Science Forum*, vols. 338–342, pp. 1287–1290.

A.K. Agarwal, N.S. Saks, S.S. Mani, V.S. Hegde and P.A. Sanger, "Investigation of Lateral RESURF, 6H–SiC MOSFETs," *Materials Science Forum*, vols. 338–342, pp. 1307–1310, 2000.

S. Sridevan and B. Jayant Baliga, "Lateral N–Channel Inversion Mode 4H–SiC MOSFET's," *IEEE Electron Device Letters*, vol. 19, No. 7, pp. 228–230, Jul. 1998.

D. Alok, E. Arnold, and R. Egloff, "Process Dependence of Inversion Layer Mobility in 4H–SiC Devices," *Materials Science Forum*, vols. 338–342, pp. 1077–1080, 2000.

K. Ueno and Tadaaki Oikawa, "Counter–Doped MOSFET's of 4H–SiC." *IEEE Electron Device Letters*, vol. 20, No. 12, pp. 624–626, Dec. 1999.

V. R. Vathulya, H. Shang, and M. H. White, "A Novel 6H–SiC Power DMOSFET with Implanted P–Well Spacer." *IEEE Electron Device Letters*, vol. 20, No. 7, Jul. 1999, pp. 354–356.

A.K. Agarwal, S. Seshadri, and L. B. Rowland, "Temperature Dependence of Fowler–Nordheim Current in 6H–and 4H–SiC MOS Capacitors." *IEEE Electron Device Letters*, vol. 18, No. 12, Dec. 1997, pp. 592–594.

P. J. Tobin, Y. Okada, S. A. Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811–1817.

Sze, S.M. *Physics of Semiconductor Devices*, John Wiley & Sons, p. 383–390.

H.F. Li, S. Dimitrijev, H.B. Harrison, D. Sweatman, and P.T. Tanner. "Improving $SiO_2$ Grown on P–Type 4H–SiC by NO Annealing." *Materials Science Forum*. vols. 264–268 (1998) pp. 869–872.

K. Ueno, R. Asai, and T. Tsuji. "4H–SiC MOSFET's Utilizing the $H_2$ Surface Cleaning Technique." *IEEE Electron Device Letters*, vol. 19, No. 7, Jul. 1998, pp. 244–246.

Chung et al. "The Effect of Si:C Source Ratio on $SiO_2$/SiC Interface State Density for Nitrogen Doped 4H and 6H–SiC," *Materials Science Forum*. (2000) vols. 338–342, pp. 1097–1100.

Pantelides et al. "Atomic–Scale Engineering of the SiC–$SiO_2$ Interface," *Materials Science Forum*. (2000) vols. 338–342, pp. 1133–1136.

Chakraborty et al. "Interface properties of $N_2O$–annealed $SiO_2$/SiC systems." *Proc. 2000 IEEE Electron Devices Meeting*. Hong Kong, China, Jun. 24, 2000, pp. 108–111.

Lipkin et al. "Challenges and State–of–the–Art Oxides in SiC," *Mat. Res. Soc. Symp. Proc.* vol. 640, Nov. 2000, pp. 27–29.

Jamet, et al. "Physical properties of $N_2O$ and NO–nitrided gate oxides grown on 4H SiC," *Applied Physics Letters*. vol. 79, No. 3, Jul. 16, 2001, pp. 323–325.

International Search Report, PCT/US 01/42414, Apr. 23, 2002, 10 pages.

Agarwal et al. "A Critical Look at the Performance Advantages and Limitations of 4H–SiC Power UMOSFET Structures," *1996 IEEE ISPSD and IC's Proc.*, May 20–23, 1996, pp. 119–122.

Lipkin et al. "Insulator Investigation on SiC for Improved Reliability," *IEEE Transactions on Electron Devices*. vol. 46, No. 3, Mar. 1999, pp. 525–532.

Agarwal et al. "Temperature Dependence of Fowler–Nordheim Current in 6H–and 4H–SiC MOS Capacitors." *IEEE Electron Device Letters*. vol. 18, No. 12, Dec. 1997, pp. 592–594.

Kobayashi et al. "Dielectric Breakdown and Current Conduction of Oxide/Nitride/Oxide Multi–Layer Structures," *1990 IEEE Symposium on VLSI Technology*. pp. 119–120.

Ma et al. "Fixed and trapped charges at oxide–nitride–oxide heterostructure interfaces formed by remote plasma enhanced chemical vapor deposition," *J. Vac. Sci. Technol. B*. vol. 11, No. 4, Jul./Aug. 1993, pp. 1533–1540.

Das, Mrinal K. Graduate thesis entitled, *Fundamental Studies of the Silicon Carbide MOS Structure*. Purdue University. No date provided.

Chakraborty et al. "Interface Properties of $N_2O$–annealed $SiO_2$/SiC system," *Proceedings IEEE Hong Kong Electron Devices Meeting*. Jun. 24, 2000, pp. 108–11.

Lipkin et al. "Insulator Investigation on SiC for Improved Reliability," *IEEE Transactions on Electron Devices*. vol. 46, No. 3, Mar. 1999, pp. 525–32.

Copy of International Search Report for PCT/US01/30715.

Lai et al. "Interface Properties of $N_2O$–Annealed $NH_3$–Treated 6H–SiC MOS Capacitor," *Proc. 1999 IEEE Hong Kong Electron Devices Meeting*, Jun. 26, 1999, pp. 46–49.

Copy of International Search Report for PCT/US02/11691.

Xu et al. "Improved Performance and Reliability of $N_2O$–Grown Oxynitride on 6H–SiH," *IEEE Electron Device Letters*. vol. 21, No. 6, Jun. 2000, p. 298–300.

Wang et al. "High Temperature Characteristics of High–Quality SiC MIS Capacitors with O/N/O Gate Dielectric," *IEEE Transactions on Electron Devices*. vol. 47, No. 2, Feb. 2000, pp. 458–462.

Lipkin et al. "Challenges and State–of–the–Art of Oxides on SiC," *Mat. Res. Symp. Proc.* vol. 640, 2001.

Cho et al. "Improvement of charge trapping by hydrogen post–oxidation annealing in gate oxide of 4H–SiC methel–oxide–semiconductor capacitors," *Applied Physics Letters*. vol. 77, No. 8, pp. 1215–1217, Aug. 2000.

Fukuda et al. "Improvement of $SiO_2$/4H–SiC Interface Using High–Temperature Hydrogen Annealing at Low Pressure and Vacuum Annealing," *Jpn J. Appl. Phys.* vol. 38, Apr. 1999, pp. 2306–2309.

Suzuki et al. "Effect of Post–oxidation–annealing in Hydrogen on $SiO_2$/4H–SiC Interface," *Materials Science Forum*, vols. 338–342 (2000) 1073–6.

Leonhard et al. "Long term stability of gate–oxides on n– and p–type silicon carbide studied by charge injection techniques," *Materials Science Engineering*, vol. 46, No. 1–3, Apr. 1997, pp. 263–266.

Fukuda et al. "Improvement of $SiO_2$/4H–SiC Interface by Using High Temperature Hydrogen Annealing at 1000° C.," *Extended Abstracts of the International Conference on Solid State Devices and Materials*, Japan Society of Applied Physics, Tokyo, Japan, Sep. 1998.

Chang et al. "Observation of a Non–stoichiometric Layer at the Silicon Dioxide—Silicon Carbide Interface: Effect of Oxidation Temperature and Post–Oxidation Processing Conditions," *Mat. Res. Soc. Symp. Proc.* vol. 640, 2001.

Derwent abstract of JP 2000–252461 A, published Sep. 14, 2000.*

International Preliminary Examination Report issued Aug. 4, 2003 for corresponding PCT application No. PCT/US02/11691.

Wang et al. "The Effects of $NH_3$ Plasma Passivation on Polysilicon Thin–Film Transistors," *IEEE Electron Device Letters*, vol. 16, No. 11, Nov. 1995, pp. 503–5.

Williams et al., "Passivation of the 4–H $SiC/SiO_2$ Interface with Nitric Oxide", *Materials Science Forum*, vols. 389–393, 2002, pp. 967–972.

Chang et al., "Effects of Anneals in Ammonia on the Interface Trap Density Near the Band Edges in 4H–Silicon Carbide Metal Oxide–Semiconductor Capacitors", *Applied Physics Letters*, vol. 77, No. 22, Nov. 22, 2000, pp. 3601–3603.

Mutin, P. Herbert, "Control of the Composition and Structure of Silicon Oxycarbide and Oxynitride Glasses Derived from Polysilioxane Precursors," *Journal of Sol–Gel Science and Technology*, vol. 14 (1999) pp. 27–38.

del Prado et al. "Full Composition Range Silicon Oxynitride Films Deposited by ECR–PECVD at Room Temperatures," *Thin Solid Films*. vol. 343–344 (1999) p. 437–440.

Wang et al., "High Temperature Characteristics of High–Quality SiC MIS Capacitors with O/N/O Gate Dieletric," *IEEE Transactions on Electron Devices*, vol. 47, No. 2, Feb. 2000.

International Search Report for PCT/US02/09393 dated Oct. 15, 2003.

Diminrijev et al., "Nitridation of Silicon–Dioxide Films Grown on 6H Silicon Carbide", *IEEE Electronic Device Letters*, vol. 18, No. 5, May 5, 1997, pp. 175–177.

De Mao et al., "Thermal Oxidation of SiC in $N_2O$", *J. Electrochem. Soc.*, vol. 141, 1994, pp. L150–L152.

Ryu et al., Article and Presentation: "27 m$\chi$–cm$^2$, 1.6 kV Power DiMOSFETs in 4H–SiC," *Proceedings of the 14 International Symposium on Power Semiconductor Devices & ICs 2002*, Jun. 4–7, 2002, Santa Fe, NM.

* cited by examiner

METHOD OF FABRICATING AN OXIDE LAYER ON A SILICON CARBIDE LAYER UTILIZING AN ANNEAL IN A HYDROGEN ENVIRONMENT

The present application is a continuation-in-part of U.S. patent application Ser. No. 09/968,391 entitled "METHOD OF N$_2$O GROWTH OF AN OXIDE LAYER ON A SILICON CARBIDE LAYER" filed Oct. 1, 2001, now U.S. Pat. No. 6,767,843 which claims priority from U.S. Provisional Application Ser. No. 60/294,307 entitled "METHOD OF N$_2$O GROWTH OF AN OXIDE LAYER ON A SILICON CARBIDE LAYER" filed May 30, 2001 and claims priority from, and is a continuation-in-part of, U.S. patent application Ser. No. 09/834,283, now U.S. Pat. No. 6,610,366, filed Apr. 12, 2001 entitled "METHOD OF N$_2$O ANNEALING AN OXIDE LAYER ON A SILICON CARBIDE LAYER" which claims priority from U.S. Provisional Application Ser. No. 60/237,822, entitled "METHOD OF IMPROVING AN INTERFACE BETWEEN A SILICON CARBIDE LAYER AND AN OXIDE LAYER" and U.S. Provisional Application Ser. No. 60/237,426 entitled "SIC POWER MOSFET AND METHOD OF FABRICATION" which were filed Oct. 3, 2000. The disclosures of each of the above-cited applications are incorporated herein by reference as if set forth fully herein.

STATEMENT OF GOVERNMENT INTEREST

The present invention was developed with Government support under contract number F33615-99-C-2914 awarded by the United States Air Force Wright Labs. The Government has certain rights in this invention.

FIELD OF THE INVENTION

The present invention relates to the fabrication of semiconductor devices and more particularly, to the fabrication of oxide layers on silicon carbide (SiC).

BACKGROUND OF THE INVENTION

Devices fabricated from silicon carbide are typically passivated with an oxide layer, such as SiO$_2$, to protect the exposed SiC surfaces of the device and/or for other reasons. However, the interface between SiC and SiO$_2$ may be insufficient to obtain a high surface mobility of electrons. More specifically, the interface between SiC and SiO$_2$ conventionally exhibits a high density of interface states, which may reduce surface electron mobility.

Recently, annealing of a thermal oxide in a nitric oxide (NO) ambient has shown promise in a planar 4H-SiC MOSFET structure not requiring a p-well implant. See M. K. Das, L. A. Lipkin, J. W. Palmour, G. Y. Chung, J. R. Williams, K. McDonald, and L. C. Feldman, "High Mobility 4H-SiC Inversion Mode MOSFETs Using Thermally Grown, NO Annealed SiO$_2$," IEEE Device Research Conference, Denver, Colo., June 19–21, 2000 and G. Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H-SiC MOSFETs Following High Temperature Anneals in Nitric Oxide," IEEE Electron Device Letters accepted for publication, the disclosures of which are incorporated by reference as if set forth fully herein. This anneal is shown to significantly reduce the interface state density near the conduction band edge. G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713–1715, Mar. 2000, the disclosure of which is incorporated herein as if set forth fully. High electron mobility (35–95 cm$^2$/Vs) is obtained in the surface inversion layer due to the improved MOS interface.

Unfortunately, NO is a health hazard having a National Fire Protection Association (NFPA) health danger rating of 3, and the equipment in which post-oxidation anneals are typically performed is open to the atmosphere of the cleanroom. They are often exhausted, but the danger of exceeding a safe level of NO contamination in the room is not negligible.

Growing the oxide in N$_2$O is possible as described in J. P. Xu, P. T. Lai, C. L. Chan, B. Li, and Y. C. Cheng, "Improved Performance and Reliability of N$_2$O-Grown Oxynitride on 6H-SiC," IEEE Electron Device Letters, Vol. 21, No. 6, pp. 298–300, June 2000, the disclosure of which is incorporated by reference as if set forth fully herein. Xu et al. describe oxidizing SiC at 1100° C. for 360 minutes in a pure N$_2$O ambient and annealing in N$_2$ for 1 hour at 1100° C.

Post-growth nitridation of the oxide on 6H-SiC in N$_2$O at a temperature of 1100° C. has also been investigated by Lai et al. P. T. Lai, Supratic Chakraborty, C. L. Chan, and Y. C. Cheng, "Effects of nitridation and annealing on interface properties of thermally oxidized SiO$_2$/SiC metal-oxide-semiconductor system," Applied Physics Letters, Vol. 76, No. 25, pp. 3744–3746, June 2000, the disclosure of which is incorporated by reference as if set forth fully herein. However, Lai et al. concluded that such treatment deteriorates the interface quality which may be improved with a subsequent wet or dry anneal in O$_2$ which may repair the damage induced by nitridation in N$_2$O. Moreover, even with a subsequent O$_2$ anneal, Lai et al. did not see any significant reduction in interface state density as compared to the case without nitridation in N$_2$O.

In addition to NO and N$_2$O growth and annealing, research has also been conducted on post growth anneals in other environments. For example, Suzuki et al. investigated post oxidation annealing in hydrogen. Suzuki et al., "Effect of Post-oxidation-annealing in Hydrogen on SiO$_2$/4H-SiC. Interface," Material Science Forum, Vols. 338–342, pp. 1073–1076, 2000. These researchers reported that flat-band voltage shift and interface state density could be improved by post oxidation annealing in both argon and hydrogen. In this research, 4H-SiC was oxidized in dry O$_2$ at 1200° C. Post oxidation annealing was then carried out in argon or hydrogen for 30 minutes at 400°, 700°, 800° and 1000° C. Other researchers, however, have reported that post oxidation anneals in hydrogen provide no increased benefit over post oxidation anneals in other gases. Mrinal Das, "Fundamental Studies of the Silicon Carbide MOS Structure," Doctoral Thesis, Purdue University, submitted December, 1999.

SUMMARY OF THE INVENTION

Embodiments of the present invention provide for fabricating a silicon carbide structure by fabricating a nitrided oxide layer on a layer of silicon carbide and annealing the nitrided oxide layer in an environment containing hydrogen. Such a fabrication of the nitrided oxide layer may be provided by forming, annealing or forming and annealing the oxide layer in at least one of nitric oxide, nitrous oxide and/or an ambient containing a reactive nitrogen species. Alternatively, the nitrided oxide layer may be provided by fabricating an oxide layer and fabricating a nitride layer on the oxide layer so as to provide the nitrided oxide layer on which the nitride layer is fabricated. Such a formation of a nitride layer may both provide the nitrided oxide layer and hydrogenate the nitrided oxide layer as hydrogen may be a byproduct of the formation of the nitride layer. Furthermore, in such embodiments, hydrogen annealing the oxide layer may be provided substantially concurrently with the step of fabricating the nitride layer.

In particular embodiments of the present invention, the silicon carbide layer comprises 4H polytype silicon carbide. The silicon carbide layer may be a silicon carbide layer on a non-silicon carbide substrate, a silicon carbide layer on a silicon carbide substrate and/or a portion of a silicon carbide substrate.

In further embodiments of the present invention, annealing the oxide layer is provided by a subsequent processing step which heats the oxide layer to a temperature of greater than about 400° C. in a hydrogen containing environment whether it be a part of a separate anneal step or other such processing step. In other embodiments of the present invention, the oxide layer is annealed at a temperature of greater than about 400° C. in a hydrogen containing environment. The oxide layer may also be annealed at a temperature of between about 400° C. and about 1000° C. in a hydrogen containing environment. In particular embodiments of the present invention, the oxide layer is annealed at a temperature of less than about 900° C. in a hydrogen containing environment. Preferably, the oxide layer is annealed at a temperature of between about 400° C. and about 800° C. in a hydrogen containing environment. Additionally, the anneal may be carried out for a time of greater than about 2 minutes.

In still further embodiments of the present invention, processing steps subsequent to the anneal in a hydrogen containing environment high temperature processing steps are also carried out in a hydrogen containing environment.

In additional embodiments of the present invention, the hydrogen anneal is preceded by forming metallization for a semiconductor device associated with the oxide layer. In such embodiments, the hydrogen anneal of the oxide layer can be provided by annealing the oxide layer at a temperature of less than about 900° C. in a hydrogen containing environment. In such embodiments, the annealing of the oxide layer may be a contact anneal. Additionally, a silicon carbide metal oxide semiconductor device may be formed having the oxide layer as a gate oxide of the metal oxide semiconductor device.

In particular embodiments of the present invention, the nitrided oxide is annealed in forming gas having about 4% hydrogen and about 96% inert gases.

In still further embodiments of the present invention, an oxide layer on a silicon carbide layer is fabricated by nitriding the oxide layer on the silicon carbide layer with at least one of nitric oxide and nitrous oxide and annealing the nitrided oxide layer at a temperature of between about 400° C. about 900° C. in a hydrogen containing environment for at least about 2 minutes.

DETAILED DESCRIPTION OF THE INVENTION

Figure 1A:
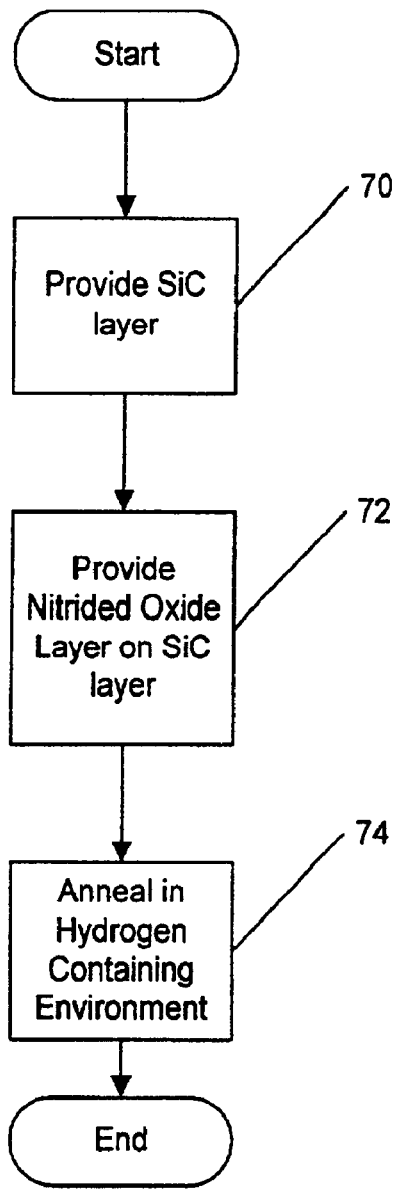
FIG. 1A is a flowchart illustrating processing steps for hydrogen annealing according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention provide methods which may improve the interface between an oxide layer and SiC in any device which includes such an interface. These methods are especially advantageous in the fabrication of Metal-Oxide-Semiconductor (MOS) devices created on SiC. Using embodiments of the present invention, interface states with energy levels near the conduction band of SiC may be dramatically reduced. Reduction of such defects may be advantageous, because these defects may limit a MOS device's effective surface channel mobility.

Figure 1B:
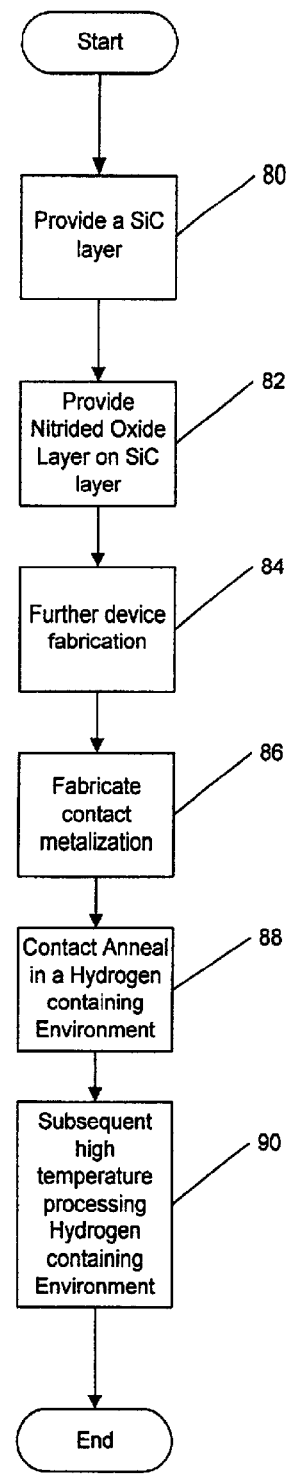
FIG. 1B is a flowchart illustrating the incorporation of additional processing steps with hydrogen annealing according to further embodiments of the present invention.

Embodiments of the present invention will now be described with reference to FIGS. 1A and 1B which are flow charts illustrating operations according to particular embodiments of the present invention. As illustrated in FIG. 1A, embodiments of the present invention utilize an anneal of a nitrided oxide layer to further reduce interface state densities at the silicon carbide oxide boundary. As used herein, the term nitrided oxide layer refers to oxide layers formed or subsequently annealed (as a separate anneal step and/or as subsequent processing such as the deposition of a nitride or oxynitride layer) in the an atmosphere which yields chemically reactive nitrogen species, such as nitrogen precursors, including nitric oxide (NO) and/or nitrous oxide ($N_2O$), and/or as part of a processing step where a reactive nitrogen species is a byproduct, to thereby introducing nitrogen into the layer.

Turning to FIG. 1A, a silicon carbide layer is provided (block 70). The SiC layer may be an epitaxial layer and/or a substrate. A nitrided oxide layer is provided on the silicon carbide layer (block 72). The nitridation may be provided, as described herein, by growth and/or anneal in an $N_2O$ and/or NO environment. Similarly, nitridation of the oxide layer may be provided by processing steps for deposition of a nitride layer on the oxide layer, for example, in an oxide-nitride (ON) or oxide-nitride-oxide (ONO) structure. ONO and ON structures are described in commonly assigned U.S. Pat. No. 6,246,076, the disclosure of which is incorporated herein by reference as if set forth fully herein. For embodiments where the nitrided oxide layer is provided by an anneal, the oxide layer may be formed by deposition, such as Low Pressure Chemical Vapor Deposition (LPCVD), thermally grown through a thermal oxidation process and/or formed using other techniques. Preferably, the oxide layer is formed utilizing a wet reoxidation process as described in U.S. Pat. No. 5,972,801, the disclosure of which is incorporated herein by reference as if set forth fully herein.

The nitrided oxide layer is annealed in a hydrogen containing environment (block 74). Such an anneal may be a separate processing step or may be part of a subsequent deposition or other such process, for example, the deposition of a nitride layer on an oxide layer in a wet environment may provide both the nitridation and anneal. The anneal is preferably carried out at a temperature of greater than about 400° C. and less than about 1000° C. Preferably, the anneal is carried out at a temperature of from about 400° C. to about 800° C. The anneal is preferably carried out for about 2 or more minutes.

The anneal in a hydrogen containing environment may be carried out immediately after nitridation or intervening steps may be performed before the anneal. Thus, as illustrated in FIG. 1B, the anneal may be provided as a subsequent processing step which provides a contact anneal. As seen in FIG. 1B, a nitrided oxide layer is provided on a SiC layer (blocks 80 and 82). Further device fabrication may then be performed to provide a silicon carbide semiconductor device (block 84). As part of or separate from the device fabrication, contact metallization is fabricated for the device (block 86). The contact metallization is then subjected to a contact anneal in a hydrogen containing environment (block 88), preferably at a temperature of greater than about 400° C. and less than about 900° C. Thus, the contact anneal provides at least part of the anneal of the nitrided oxide layer in a hydrogen containing environment. Subsequent high temperature processing steps are then also carried out in a hydrogen containing environment (block 90).

For example, in a silicon carbide metal oxide semiconductor device, the anneal may be provided subsequent to metallization of the device by performing a contact anneal in a hydrogen containing environment at a temperature of less than about 900° C. Thus, for example, the oxide layer may provide a gate oxide of a metal oxide semiconductor field effect transistor (MOSFET). The contact anneal may anneal the contacts of the device as well as provide the anneal of the nitrided oxide. Whenever in the fabrication process the anneal of the nitrided oxide layer takes place, it may be preferred that subsequent high temperature (i.e. processing at temperatures greater than about 400° C.) processing be conducted in a hydrogen containing environment.

As used herein, the term hydrogen containing environment refers to hydrogen and/or a hydrogen precursor either alone or in combination with other gases. For example, a forming gas of 4% hydrogen and 96% argon may be utilized for the hydrogen anneal. Similarly, the hydrogen may be provided by a hydrogen precursor, such as $NH_3$ and/or may be a byproduct of a processing step. Thus, the present invention should not be construed as limited to pure hydrogen environments but includes hydrogen and/or hydrogen precursors as a constituent gas with other gases as well.

Figure 2:
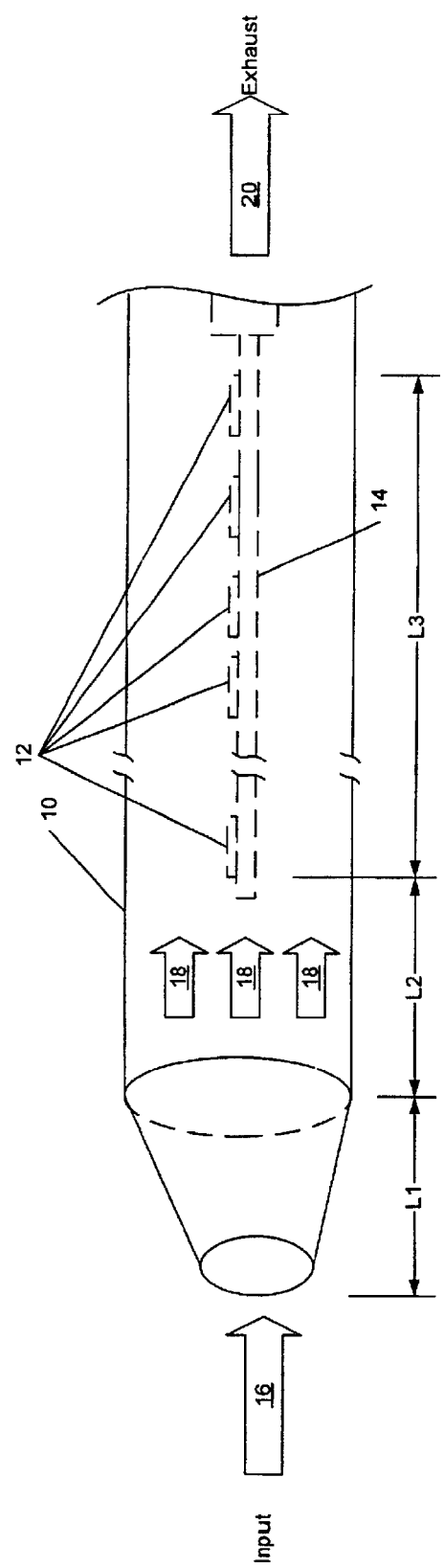
FIG. 2 is a schematic illustration of a furnace tube suitable for use in embodiments of the present invention.

FIG. 2 is an illustration of a furnace tube suitable for use in particular embodiments of the present invention to provide the nitrided oxide layer. As seen in FIG. 2, the furnace tube 10 has a plurality of wafers 12 of SiC either with an oxide layer, such as $SiO_2$, formed thereon or on which an oxide layer is to be formed. Preferably, the SiC wafer is 4H-SiC. The wafers 12 are placed on a carrier 14 such that the wafers will, typically have a fixed position in the furnace tube 10. The carrier 14 is positioned so that the wafers are a distance L1+L2 from an inlet of the furnace tube 10 and extend for a distance L3 within the furnace tube 10. Input gases 16, which may include $N_2O$ and/or NO, are passed into the furnace tube 10 and are heated as they traverse the distance L1 based on a predetermined temperature profile so as to provide the heated gases 18. The heated gases 18 may be maintained at temperatures based on the predetermined temperature profile and traverse the distance L2 to reach the first of the wafers 12. The heated gases 18 continue to pass through the furnace tube 10 until they leave the furnace tube 10 through an outlet port as exhaust gases 20. Thus, the heated gases 18 traverse the distance L3. The heated gases 18 are preferably maintained at a substantially constant temperature for the distances L2 and L3, however, as will be appreciated by those of skill in the art in light of the present disclosure, various temperature profiles may also be utilized. Such profiles may include variations in temperature over time and/or distance. However, in embodiments where the nitrided oxide layer is provided by an $N_2O$ anneal and/or oxidation, the predetermined temperature profile should include either an anneal temperature of greater than about 1100° C. or an oxidation temperature of at least about 1200° C.

As is seen in FIG. 2, the heated gases 18 may reach a temperature at which the $N_2O$ begins to break down into its constituents at the end of the L1 distance. This distance may depend on the physical characteristics of the furnace tube 10, the predetermined temperature profile and the flow rate profile. The heated gases 18 also traverse the distance L2 before reaching the wafers 12. The amount of time that it takes the heated gases to traverse the distance L2 is referred to herein as an "initial residence time." Preferably, the heated gasses are maintained at a substantially constant temperature corresponding to an anneal temperature of greater than about 1100° C. or an oxidation temperature of at least about 1200° C. for the initial residence time. However, as will be appreciated by those of skill in the art, differing heating profiles could be utilized which increase or decrease the initial residence time. It may be preferred, however, that the heating profile be rapid such that the initial residence time is substantially the same as the time that the heated gases 18 are maintained at an anneal temperature of greater than about 1100° C. or an oxidation temperature of at least about 1200° C. before traversing the L3 distance.

The total amount of time that it takes the heated gases 18 to traverse the distance L2+L3 is referred to herein as the "total residence time." As will be appreciated by those of skill in the art in light of the present disclosure, these residence times depend on the velocity of the heated gases 18 through the furnace tube 10 which may be determined based on the flow rates of the heated gases 18 and the cross-sectional area of the furnace tube 10. Such velocities may be average velocities, for example, if turbulent flow is achieved, or may be actual velocities, for example, in laminar flow systems. Thus, the term velocity is used herein to refer to both average and actual velocities.

As discussed above, the nitrided oxide layer may be provided by, among other ways, growth and/or anneal in an NO and/or an $N_2O$ environment. NO growth and/or annealing as described above may be utilized alone or in combination with $N_2O$ growth and/or annealing. If the nitrided oxide layer if provided by growth and/or annealing in an $N_2O$ environment, it is preferred that such growth and/or annealing be carried out at a predetermined temperature and a predetermined flow rate as described herein.

For $N_2O$ annealing, preferably, the oxide is annealed using a predetermined temperature profile which includes an anneal temperature of greater than about 1100° C. in a chamber in which $N_2O$ is supplied at a flow rate profile within predetermined flow rate limits. Preferably, the temperature of the anneal is about 1175° C. or higher and more preferably, about 1200° C. may be utilized. The flow rate limits of $N_2O$ may be selected based on the particular equipment in which the process is used. However, in particular embodiments the flow rate limits of $N_2O$ may be as low as about 2 Standard Liters per Minute (SLM) or as high as about 8 SLM. In further embodiments, flow rate limits of from about 3 to about 5 SLM may be preferred. For particular furnaces as illustrated in FIG. 2, gas velocities as low as about 0.37 cm/sec or as high as about 1.46 cm/sec or velocities of from about 0.55 cm/s to about 0.95 cm/s may be suitable. In particular, for an L2 distance of about 12 inches (about 30.48 cm) and an L3 distance of about 18 inches (about 45.72 cm), such velocities result in an initial residence time of from about 11 seconds to about 45 seconds and a total residence of from about 28 seconds to about 112 seconds. In particular preferred embodiments, the initial residence time is from about 16 seconds to about 31 seconds and a total residence time of from about 41 to about 73 seconds. The $N_2O$ and/or NO anneal may be carried out for about 3 hours, however, anneals of from about 30 minutes to about 6 hours may also be utilized although longer times may also be utilized.

For $N_2O$ growth, preferably the SiC wafers 12 are oxidized using a predetermined temperature profile which includes an oxidation temperature of greater than about 1200° C. in a chamber in which $N_2O$ is supplied at a flow rate profile within predetermined flow rate limits. Preferably, the temperature of the oxidation is about 1300° C. The flow rate limits of $N_2O$ may be selected based on the particular equipment in which the process is used. However, in particular embodiments, the flow rate limits of $N_2O$ may be as low as about 2 Standard Liters per Minute (SLM) or as high as about 6 SLM or higher. In further embodiments, flow rate limits of from about 3.5 SLM to about 4 SLM may be preferred. Thus, for a particular apparatus, gas velocities as low as about 0.37 cm/sec or as high as about 1.11 cm/sec may be utilized, while velocities of from about 0.65 cm/s to about 0.74 cm/s may be preferred. In particular, for an L2 distance of about 12 inches (about 30.48 cm) and an L3 distance of about 18 inches (about 45.72 cm), such velocities result in an initial residence time of from about 11 seconds to about 33 seconds and a total residence time of from about 28 seconds to about 84 seconds. In particular preferred embodiments, the initial residence time is from about 19 second to about 22 seconds and the total residence time is from about 49 to about 56 seconds. The $N_2O$ oxidation may be carried out for an amount of time dependent on the desired thickness of the oxide layer. For example, oxidation times of about 3 hours or greater may be utilized. As used herein, $N_2O$ refers to pure $N_2O$ or $N_2O$ in combination with other oxidizing agents, such as steam, $O_2$, and/or inert gases.

Oxidation in an NO and/or $N_2O$ environment and/or anneals in an NO and/or $N_2O$ environment may be followed by an optional anneal in inert gas or gases, such as argon and/or $N_2$ or combinations thereof with other gases. Such an anneal may be carried out for about 1 hour, however, anneals of up to about 3 hours or longer may also be utilized.

Figure 3:
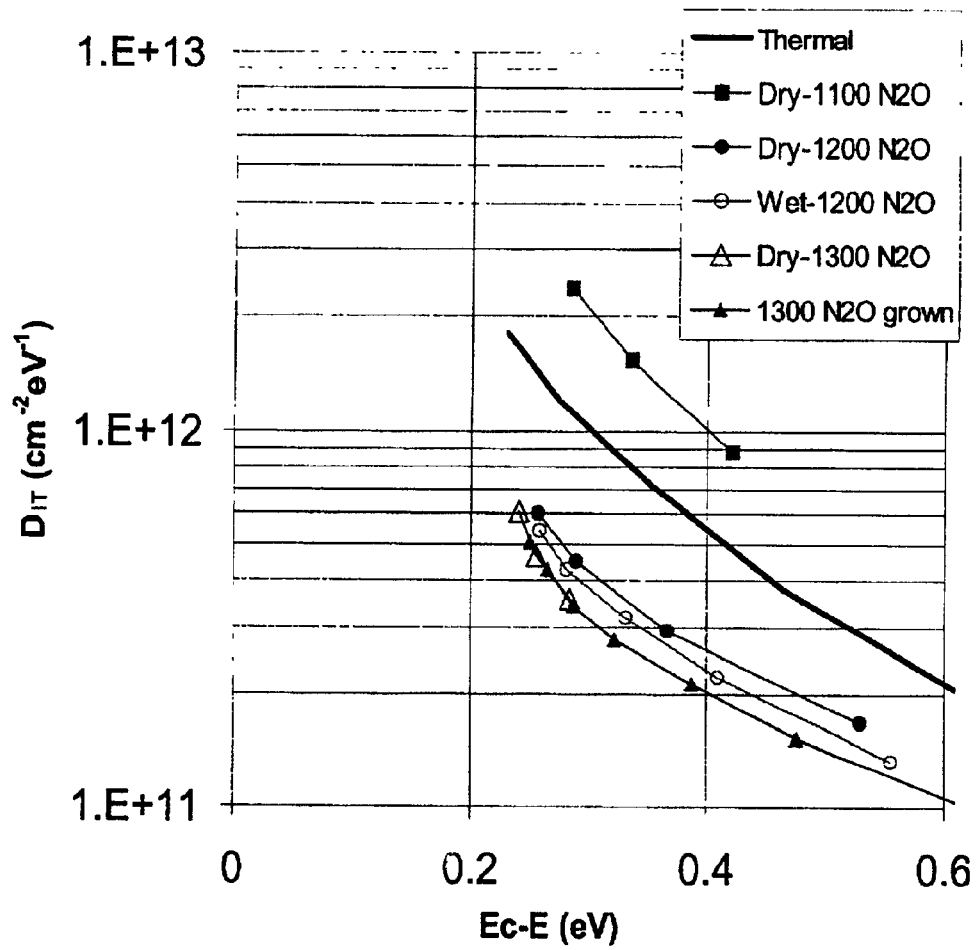
FIG. 3 is a graph of $D_{IT}$ versus energy level from the conduction band for various thermal oxidation, post-growth $N_2O$ anneals and $N_2O$ oxidation.

FIGS. 3 through 6 illustrate results which may be obtained utilizing embodiments of the present invention. FIG. 3 illustrates results which were obtained for $N_2O$ growth and $N_2O$ annealing without subsequent annealing in a hydrogen containing environment. FIGS. 4A, 4B, 5 and 6 illustrate results obtained with a hydrogen anneal of a nitrided oxide layer.

As shown in FIG. 3, the solid line represents a thermally grown oxide without nitridation. At lower temperatures (1100° C.), exposing an existing oxide to $N_2O$ increases the interface state density, as shown by comparing the heavy solid line representing a thermal oxide to the data for the same thermal oxide exposed to an 1100° C. $N_2O$ anneal. At 1200° C., the thermal oxide is significantly improved with the $N_2O$ anneal. Thermal oxides processed in a wet ambient may be further improved by the 1200° C. $N_2O$ anneal, as seen by comparing the solid circle to the open circle data. Further improved results were obtained using a 1300° C. $N_2O$ anneal process (the DRY-1300 line) and the 1300° C. $N_2O$ growth process (the 1300 grown line). At this temperature, the oxidation of SiC is significant. So, in addition to annealing existing oxides in $N_2O$, some oxides were grown in the $N_2O$ ambient (500 Å was grown in 3 hours). Growing the oxide in $N_2O$ may save about 9 hours of processing time over annealing an existing oxide in $N_2O$, by eliminating the oxidation step. As is seen in FIG. 3 by comparing the Dry-1300 line to the 1300 grown line, substantially the same results were obtained regardless of whether the oxide was grown prior to $N_2O$ processing or grown in $N_2O$.

Figure 4A:
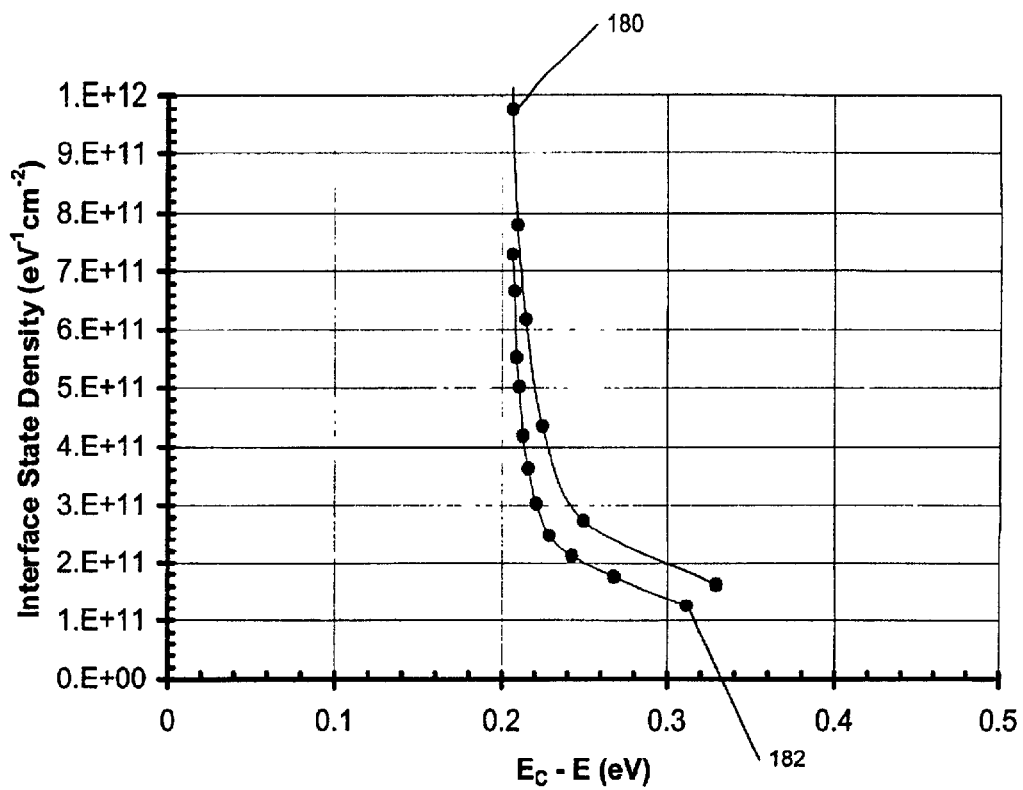
FIGS. 4A and 4B are graphs of interface state density for an oxide which has been $N_2O$ annealed at 1300° C. measured before and after anneal at 800° C. in a forming gas of 4% hydrogen and 96% inert gases according to embodiments of the present invention.
Figure 4B:
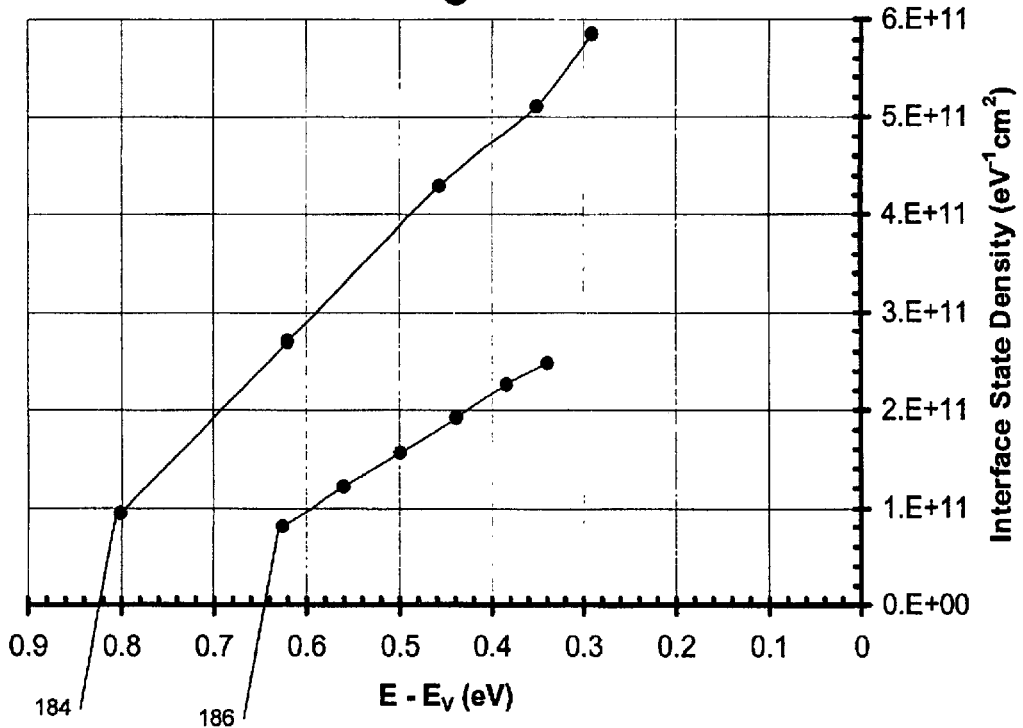

FIGS. 4A and 4B are graphs of interface state density for an oxide which has been $N_2O$ annealed at 1300° C. measured before and after anneal at 800° C. in a forming gas of 4% hydrogen and 96% inert gases. As is illustrated in FIG. 4A, line 180 illustrates the interface trap density for the oxide before the anneal and line 182 after the anneal. In FIG. 4B, line 184 illustrates the interface trap density for the oxide before the anneal and line 186 after the anneal. Lines 180 and 184 may represent the lowest reported values for $D_{IT}$ on the 4H-SiC MOS interface. The 4% hydrogen present in the forming gas further improves this result on both the upper (FIG. 4B) and lower (FIG. 4A) halves of the bandgap.

Figure 5:
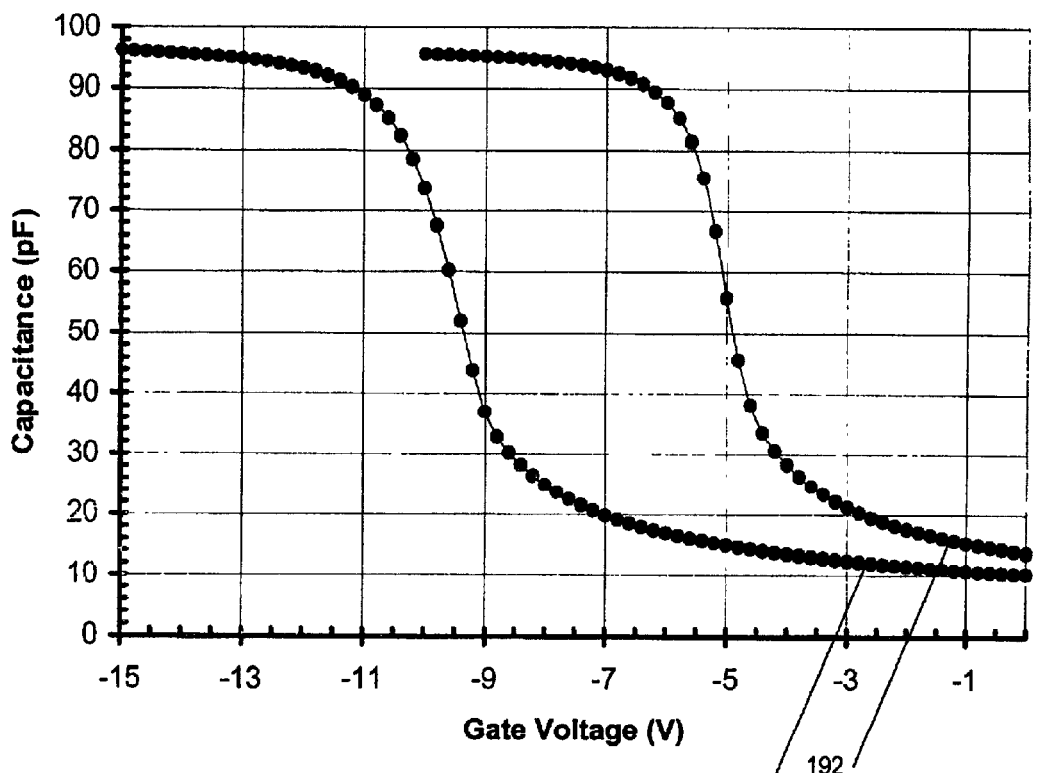
FIG. 5 is a graph of capacitance versus voltage for capacitors having an oxide which has been $N_2O$ annealed at 1300° C. measured before and after anneal at 800° C. in a forming gas of 4% hydrogen and 96% inert gases according to embodiments of the present invention.

FIG. 5 is a graph of capacitance versus voltage for capacitors having an oxide which has been $N_2O$ annealed at 1300° C. measured before and after anneal at 800° C. in a forming gas of 4% hydrogen and 96% inert gases. In FIG. 5, line 190 illustrates the capacitance for the oxide before the anneal and line 192 after the anneal. As is seen in FIG. 5, the forming gas anneal reduces the flatband voltage by 4.5 Volts, which corresponds to a $1.7E12\ cm^{-2}$ reduction in effective oxide charge.

Figure 6:
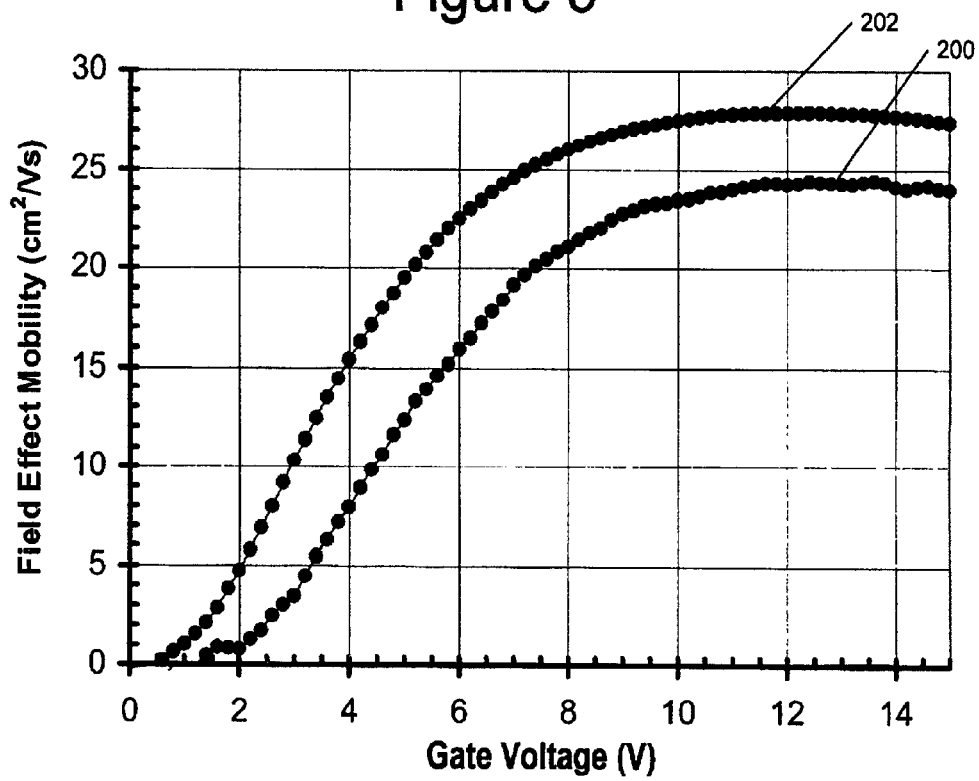
FIG. 6 is a graph of field effect mobility versus gate voltage for MOSFETs having a gate oxide which has been $N_2O$ annealed at 1300° C. measured before and after anneal at 800° C. in a forming gas of 4% hydrogen and 96% inert gases according to embodiments of the present invention.

FIG. 6 is a graph of field effect mobility versus gate voltage for MOSFETs having a gate oxide which has been $N_2O$ annealed at 1300° C. measured before and after anneal at 800° C. in a forming gas of 4% hydrogen and 96% inert gases. In FIG. 6, line 200 illustrates field effect mobility for MOSFETs with a nitrided gate oxide before the anneal and line 202 after the anneal. As is seen in FIG. 6, inversion channel mobility increases by almost 20% and the threshold voltage is reduced by 2 V.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an insulator in a silicon carbide electronic device, comprising:
    fabricating a nitrided oxide layer on a layer of 4H polytype silicon carbide; and
    annealing the nitrided oxide layer in an environment containing hydrogen at a temperature of less than about 900° C.;
    wherein fabricating a nitrided oxide layer comprises at least one of forming the nitrided oxide layer in at least one of nitric oxide and nitrous oxide and annealing an exiting oxide layer in at least one of nitric oxide and nitrous oxide.

2. The method according to claim 1, wherein the silicon carbide layer comprises a silicon carbide layer on a non-silicon carbide substrate.

3. The method according to claim 1, wherein the silicon carbide layer comprises a portion of a silicon carbide substrate.

4. The method of claim 1, wherein the step of annealing the nitrided oxide layer comprises annealing the oxide layer to a temperature of greater than about 400° C. in a hydrogen containing environment.

5. The method of claim 1, wherein the step of annealing the oxide layer comprises annealing the nitrided oxide layer at a temperature of between about 400° C. and about 800° C. in a hydrogen containing environment.

6. The method of claim 1, wherein the step of annealing is preceded by the step of forming metallization for a semiconductor device associated with the nitrided oxide layer.

7. The method of claim 6, wherein the step of annealing the nitrided oxide layer comprises a metal contact anneal.

8. The method of claim 1 further comprising forming a silicon carbide metal oxide semiconductor device having the oxide layer as a gate oxide of the metal oxide semiconductor device.

9. The method of claim 1, wherein the step of annealing the nitrided oxide layer is carried out for at least about 2 minutes.

10. A method of forming an insulator in a silicon carbide electronic device, comprising:
    fabricating a nitrided oxide layer on a layer of silicon carbide; and
    annealing the nitrided oxide layer in $H_2$ and/or $NH_3$;
    wherein the step of fabricating a nitrided oxide layer comprises the steps of:
    fabricating an oxide layer; and
    fabricating a nitride layer on the oxide layer so as to nitridate the oxide layer on which the nitride layer is fabricated;
    wherein annealing the nitrided oxide layer in an environment containing hydrogen is provided substantially concurrently with the step of fabricating the nitride layer so that the step of fabricating a nitride layer on the oxide layer comprises fabricating a nitride layer on the oxide layer so as to nitridate and hydrogenate the oxide layer on which the nitride layer is fabricated.

* * * * *

UNITED STATES PATENT AND TRADEMARK OFFICE
CERTIFICATE OF CORRECTION

PATENT NO. : 7,067,176 B2 Page 1 of 1
APPLICATION NO. : 10/045542
DATED : June 27, 2006
INVENTOR(S) : Das et al.

It is certified that error appears in the above-identified patent and that said Letters Patent is hereby corrected as shown below:

Column 9,
Line 21 should read -- existing oxide layer in at least one of nitric oxide and --

Signed and Sealed this

Twenty-first Day of November, 2006

JON W. DUDAS
*Director of the United States Patent and Trademark Office*